(12) United States Patent
Bhandari

(10) Patent No.: US 8,460,464 B2
(45) Date of Patent: Jun. 11, 2013

(54) METHOD FOR PRODUCING SINGLE CRYSTALLINE DIAMONDS

(76) Inventor: Rajneesh Bhandari, Jaipur Rajasthan (IN)

( * ) Notice: Subject to any disclaimer, the term of this patent is extended or adjusted under 35 U.S.C. 154(b) by 995 days.

(21) Appl. No.: 12/460,481

(22) Filed: Jul. 20, 2009

(65) Prior Publication Data

US 2010/0242834 A1 Sep. 30, 2010

(30) Foreign Application Priority Data

Mar. 31, 2009 (IN) .............................. 650/DEL/2009

(51) Int. Cl.
*C30B 23/00* (2006.01)
*C30B 25/00* (2006.01)
*C30B 28/12* (2006.01)
*C30B 28/14* (2006.01)

(52) U.S. Cl.
USPC ................... 117/97; 117/84; 117/88; 117/90; 117/94

(58) Field of Classification Search
USPC ..................................... 117/97, 84, 88, 90, 94
See application file for complete search history.

(56) References Cited

U.S. PATENT DOCUMENTS

| | | | | |
|---|---|---|---|---|
| 6,162,412 A * | 12/2000 | Fujimori et al. | ............. | 423/446 |
| 7,399,358 B2 * | 7/2008 | Bhandari | ........................ | 117/96 |
| 2006/0266279 A1 * | 11/2006 | Mokuno et al. | ................. | 117/68 |
| 2008/0190356 A1 * | 8/2008 | Bhandari | ........................ | 117/98 |

OTHER PUBLICATIONS

Characterisation of High-quality Thick Single-crystal Diamond Grown by CVD with a Low Nitrogen Addition' by A. Tallaire et al., 'Diamond and Related Materials', vol. 15, Issue 10, Oct. 2006, pp. 1700-1707.
Identification of Synthetic Diamond Grown using Chemical Vapor Deposition (CVD)' by Philip M. Martineau et al., 'Gems & Gemology', vol. 40, No. 1, 2004, pp. 2-25.
The Effect of Nitrogen Addition during High-rate Homoepitaxial Growth of Diamond by Microwave Plasma CVD' by A. Chayahara et al., 'Diamond and Related Materials' vol. 13, Issues 11-12, Nov.-Dec. 2004, pp. 1954-1958.
High Rate Homoepitaxial Growth of Diamond by Microwave Plasma CVD with Nitrogen Addition', by Y. Mokuno et al., 'Diamond and Related Materials' vol. 15, Issues 4-8, Apr.-Aug. 2006, pp. 455-459.

* cited by examiner

*Primary Examiner* — James McDonough
(74) *Attorney, Agent, or Firm* — William L. Botjer

(57) ABSTRACT

A method for producing one or more single crystalline diamonds. The method comprises placing one or more substrates on a substrate holder in chemical vapor vaporization (CVD) chamber. A mixture of gases including at least one gas having a carbon component is provided adjacent to the one or more substrates in the CVD chamber. Thereafter, the mixture of gases is exposed to microwave radiation to generate a plasma. Reactive species of nitrogen produced in a remote reactive gas generator are introduced in the plasma. Then, the one or more substrates are exposed to the plasma, such that diamond growth occurs at a rate of 10 to 100 microns per hour, to produce one or more single crystalline diamonds.

28 Claims, 1 Drawing Sheet

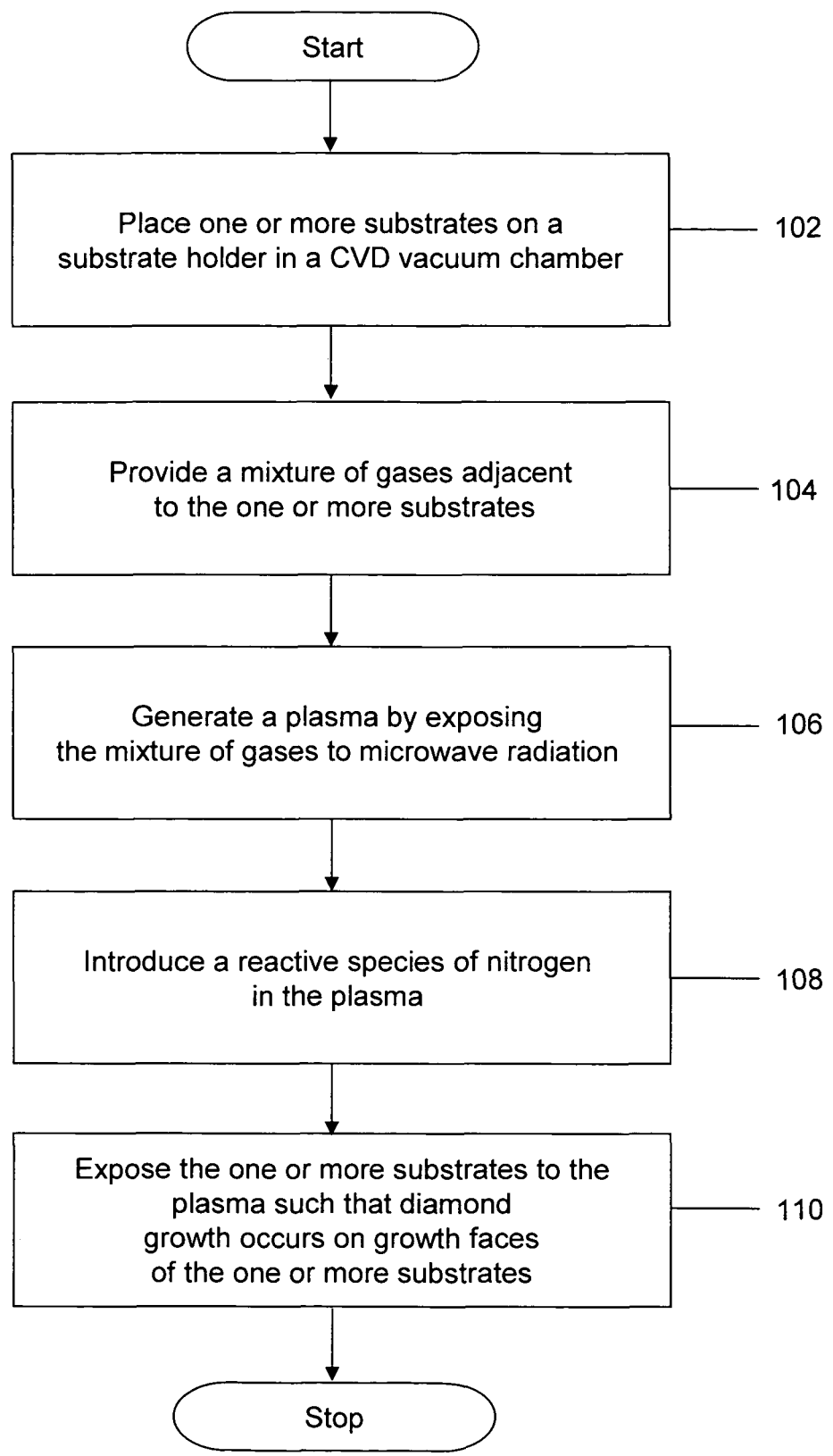

METHOD FOR PRODUCING SINGLE CRYSTALLINE DIAMONDS

This application claims priority from Indian patent application Ser. No. 650/DEU/2009 filed on Mar. 31, 2009 and titled 'METHOD FOR PRODUCING SINGLE CRYSTALLINE DIAMONDS'.

BACKGROUND

The invention relates generally to a method for producing one or more single crystalline diamonds through the Microwave Plasma Chemical Vapor Deposition (MPCVD) process. More specifically, the invention relates to a method for producing high quality one or more single crystalline diamonds through the MPCVD process using reactive species of nitrogen.

A diamond is a crystalline allotrope of carbon. Diamonds are renowned for their superlative physical qualities, especially their hardness and high dispersion of light. These properties make diamonds valued for use in jewelry and a variety of industrial applications. Diamonds are broadly classified into natural and synthetic diamonds on the basis of their origin. Natural diamonds are formed naturally in the earth by prolonged exposure of carbon-bearing materials to high pressure and temperature. Scientists have been able to produce synthetic diamonds in laboratory conditions which have the same chemical composition and physical properties as natural diamonds.

Natural diamonds possess a color that can range from colorless to yellow, orange, red, pink, blue, green, brown, and black. The four 'Cs', i.e., cut, color, clarity, and carat size, generally determine the price of a diamond. If these three parameters, i.e., cut, clarity, and carat size, are constant, the color of the diamond plays an important role in the pricing of the diamond. The four 'Cs' mentioned above are also used for valuation of synthetic diamonds. Fancy-colored diamonds and clear or colorless diamonds are highly priced, and are extensively used in making jewelry. Even the faintest tinge of yellow considerably reduces the price of colorless diamonds. In natural diamonds, brownish-colored diamonds are the most common and relatively inexpensive. Therefore, an aesthetic and economic incentive exists, to produce synthetic diamonds that are not brown, and are colorless or near colorless.

Synthetic diamonds can be produced using a variety of methods. One such method uses high pressure high temperature (HPHT) to produce synthetic diamonds. A carbon substrate such as graphite is exposed to a pressure exceeding 50 kilobars and a temperature exceeding 1200° C. in the presence of a catalyst metal, such as nickel, cobalt, and iron, to produce a diamond. The diamond thus produced is known as a HPHT-grown diamond. However, it is generally difficult and expensive to produce a large-sized, high-quality colorless single crystalline diamond using the HPHT method. Another method, chemical vapor deposition (CVD), is used to synthesize diamonds from the gas phase at below atmospheric pressures and temperatures above 800° C. A mixture of hydrogen and hydrocarbon gas is activated using a variety of methods, such as thermal (hot filament) or plasma (direct current, radio frequency or microwave) activation, or the use of a combustion flame (oxyacetylene or plasma torches). This dissociates the hydrogen gas into atomic hydrogen, and the hydrocarbon gas into active carbon ions, atoms or CH radicals, which deposit on a substrate to form a diamond. The diamond thus produced is known as a CVD-grown diamond.

The quality and growth rate of CVD-grown diamonds in a MPCVD system is dependent on different parameters such as the methane (hydrocarbon gas) flow rate, the hydrogen flow rate, the nitrogen flow rate, the pressure (Torr) and the temperature of the substrate, the type of substrate used, and the microwave power. Most of the parameters mentioned above are inter-dependent, and a window for growing good quality diamond growth is very narrow. However, nitrogen plays a very important role in influencing the growth rate and morphology of diamonds.

A paper titled 'Characterisation of High-quality Thick Single-crystal Diamond Grown by CVD with a Low Nitrogen Addition' by A. Tallaire et al., published in 'Diamond and Related Materials', Volume 15, Issue 10, October 2006, Pages 1700-1707, describes that addition of small amounts of nitrogen, 2 to 10 ppm, to the gas phase in a high microwave power MPCVD process results in an increase of diamond growth rates by almost a factor of 3.

A paper titled 'Identification of Synthetic Diamond Grown using Chemical Vapor Deposition (CVD)' by Philip M. Martineau et al., published in 'Gems & Gemology', Volume 40, No. 1, 2004, Pages 2-25, describes that samples grown with added nitrogen were found to range from faint brown to dark brown (or black in extreme cases). Further, for a given sample thickness, there was a strong correlation between the nitrogen concentration in the process gases and the saturation of the brown color. Still further, Cao et al. have reported that the growth of a diamond film on (100) surface shows the highest growth rate, as compared with that on (111) and (110) surfaces with the addition of 100 ppm nitrogen.

A paper titled 'The Effect of Nitrogen Addition during High-rate Homoepitaxial Growth of Diamond by Microwave Plasma CVD' by A. Chayahara et al., published in 'Diamond and Related Materials' Volume 13, Issues 11-12, November-December 2004, Pages 1954-1958, describes that nitrogen addition can enhance the growth rate of a diamond by a factor of 2 and can create a macroscopic smooth (100) face avoiding the growth hillocks. Further, it was found that the introduction of nitrogen of up to 2 sccm resulted in an increase in the growth rate, and no significant increase in the growth rate was observed above the flow rate of 2 sccm.

A paper titled 'High Rate Homoepitaxial Growth of Diamond by Microwave Plasma CVD with Nitrogen Addition', by Y. Mokuno et al., published in 'Diamond and Related Materials' Volume 15, Issues 4-8, April-August 2006, Pages 455-459, describes the effect of nitrogen on diamond films grown at the growth temperature range of 1060° C. to 1250° C. The color became dark for the film grown at a temperature of 1060° C. It was reported that this may be attributed to the incorporation of higher amount of nitrogen or the increasing number of defects at the lower temperature region with high N/C ratio in the gas. However, the total amount of nitrogen in the high rate grown diamond was not directly measured. The amount of nitrogen incorporated in the films increased with the increasing nitrogen flow rate. Further, it was reported that the nitrogen concentrations in the films were 8.9 ppm to 39 ppm, which were comparable with the typical value of the HPHT synthetic Ib diamond.

U.S. Pat. No. 7,399,358 titled 'Synthesis of large Homoepitaxial Monocrystalline Diamond' assigned to Rajneesh Bhandari, India, describes a method for producing a large homoepitaxial monocrystalline diamond. The method includes placing at least two substrates in a substrate holder in a CVD chamber. The substrates are positioned in such a manner that the growth faces of the substrates form a wedge. The substrates are exposed to the plasma under such conditions that diamond growth occurs in the wedge between the substrates, to form a large homoepitaxial monocrystalline diamond. Nitrogen may be added in the form of nitrogen gas to produce a yellow or brown-colored diamond growth.

WIPO Application WO/2008/099422 titled 'Method and Apparatus for Producing Single Crystalline Diamonds', applicant Rajneesh Bhandari, India, describes a method and an apparatus for producing single crystalline diamonds. Diamond seeds are placed in a substrate holder in a CVD chamber. Metal discs are then positioned in the CVD chamber such that high temperature is generated at low microwave power. A plasma is generated in the CVD chamber. Under certain conditions the diamond seeds are then exposed to the plasma to form single crystalline diamonds. The position of the plasma is manipulated to provide uniform growth conditions at the growth surface of the one or more diamond seeds.

U.S. Pat. No. 6,162,412, titled 'Chemical Vapor Deposition Method of High Quality Diamond', assigned to Sumitomo Electric Industries, Ltd., Osaka, Japan, describes a method for producing a diamond that contains nitrogen in a small amount through a CVD process. The decrease of the nitrogen atom content in the diamond is achieved by decreasing the nitrogen atom content in the reaction gas.

However, one of the limitations of growing single crystalline diamonds using the available CVD methods is that there is little control over the browning of the diamond which decreases the economic value of the diamond. Further, the available CVD methods consume a considerable amount of time; therefore, these methods are not economical. It is difficult to produce high-quality colorless diamonds at high growth rates using the available CVD methods. Furthermore, these methods require a large amount of nitrogen to produce diamonds at high growth rates which results in browning of the diamonds due to unavoidable extra nitrogen atoms.

In light of the foregoing discussion, there is a need for a method for growing diamonds using the CVD process, which provides high-quality diamonds at high growth rates without resulting in browning of the diamonds. Further, the method should be less time consuming and more economical.

SUMMARY

Embodiments of the invention provide a method for producing one or more single crystalline diamonds for use in jewelry and ornaments as well as in electronics and other scientific applications.

An object of the invention is to provide a method for producing high-quality one or more single crystalline diamonds that are colorless or near colorless.

Yet another object of the invention is to provide a method for producing high-quality one or more single crystalline diamonds at high growth rates.

Yet another object of the invention is to provide a method for producing high-quality one or more single crystalline diamonds without resulting in browning of the diamonds.

Still another object of the invention is to provide a method for producing one or more single crystalline diamonds at high growth rates without resulting in browning of the diamonds.

In the preferred embodiment, the invention is directed to a method for producing one or more single crystalline diamonds. The method comprises placing one or more substrates on a substrate holder in a chemical vapor deposition (CVD) vacuum chamber. The Growth faces of the one or more substrates have a crystallographic orientation of (100). A mixture of gases, including at least one gas having a carbon component, is provided adjacent to the one or more substrates in the CVD vacuum chamber. The mixture of gases is exposed to microwave radiation to generate a plasma. Reactive species of nitrogen are introduced in the plasma, such that the concentration of the reactive species of nitrogen is 0.005 ppm to 2 ppm in the mixture of gases. The reactive species of nitrogen are produced in a remote reactive gas generator. The substrates are exposed to the plasma, such that the diamond growth occurs on the growth faces of the one or more substrates at a rate of 10 to 100 microns per hour, to produce the one or more single crystalline diamonds.

An advantage of the present invention is that it provides a method for producing one or more single crystalline diamonds for use in jewelry and ornaments as well as in electronics and other scientific applications.

Another advantage of the present invention is that it provides a method for producing high-quality one or more single crystalline diamonds that are colorless or near colorless.

Yet another advantage of the present invention is that it provides a method for producing high-quality one or more single crystalline diamonds at very high growth rates using reactive species of nitrogen that are remotely produced in a remote gas generator.

Still another advantage of the present invention is that it is less time consuming and more economical, to produce one or more single crystalline diamonds by providing reactive species of nitrogen. The present invention does not require large concentrations of nitrogen for achieving high growth rates, and thus there is no brown coloration. Furthermore, the electronic properties of the one or more single crystalline diamonds are not affected.

BRIEF DESCRIPTION OF THE DRAWINGS

Various embodiments of the invention will hereinafter be described in conjunction with the appended drawings provided to illustrate and not to limit the invention, wherein like designations denote like elements, and in which:

FIG. 1 is a flowchart illustrating a method for producing one or more single crystalline diamonds, in accordance with an embodiment of the invention.

DESCRIPTION OF PREFERRED EMBODIMENTS

For the sake of convenience, the terms used to describe various embodiments are described below. It should be understood that these are provided to merely aid the understanding of the description, and that definitions in no way limit the scope of the invention.

Natural diamond: It is a diamond formed naturally in the earth by prolonged exposure of carbon-bearing materials to high pressure and temperature.

Synthetic diamond: It is a diamond produced under laboratory conditions with all the physical and chemical properties of a natural diamond.

Type Ia diamond: About 98% of natural diamonds are Type Ia, which are characterized by the presence of nitrogen in a substantial amount (up to 3000 ppm). Nitrogen is distributed in small aggregates substituting for neighboring carbon atoms.

Type Ib diamond: Type Ib diamonds are less than 1% in nature. Nitrogen is dispersed through the crystal structure as single substituting atoms.

Type IIa diamond: Type IIa diamonds are rare (1-2%) in nature. They are characterized by nitrogen impurity levels, which are below the levels that can be detected by standard infrared techniques.

Type IIb diamond: Type IIb diamonds are extremely rare (0.1%) in nature. They have boron as impurity, which gives a blue color.

High pressure high temperature (HPHT): It is a process in which a diamond is crystallized from metal solvated carbon at pressures of about 50-100 kbar and temperatures of about 1800-2300K.

Chemical vapor deposition (CVD): Is a method for growing diamond by creating the environment and conditions necessary for carbon atoms in a mixture of gases to settle on a diamond substrate in diamond crystalline form. It involves feeding a mixture of gases into a chamber, energizing them to generate plasma and providing conditions for diamond growth on the substrate. The gases always include a carbon source, and typically include hydrogen as well.

Microwave: Microwaves are electromagnetic radiation with frequencies in the range of 300 MHz to 300 GHz. Electromagnetic radiation comprises electric and magnetic fields perpendicular to each other. Microwaves in the range of 2.45 GHz to 30 GHz frequencies are commonly used for scientific and industrial purposes.

Plasma: Plasma is a hot/cold ionized gas comprising ions, electrons, etc.

Diamond Substrate: A diamond substrate is a raw material on the surface of which diamond growth takes place.

Substrate Holder: It is a device that holds a diamond substrate inside a CVD chamber.

Raman Spectroscopy: Raman spectroscopy is a technique that measures certain physical properties by measuring the amount of light that a substance scatters at certain wavelengths.

Reactive species of nitrogen: These are nitrogen free radicals formed in a remote reactive gas generator.

Single Crystalline: In single crystalline solids the atoms or molecules are stacked in a regular manner, forming a three-dimensional pattern which may be obtained by a three-dimensional repetition of a certain pattern unit called a unit cell. In a single crystalline material the periodicity of the pattern extends throughout the material.

Crystallographic orientation: This is an orientation of a crystal face, as defined by miller indices.

(100) Crystallographic orientation: A face of a diamond which cuts only one axis (i.e., x) and is parallel to the other two axis (i.e., y and z) has (100) crystallographic orientation.

Homoepitaxial: Epitaxial deposition process in which the chemical composition of epi material and the substrate are the same, for example, (111) oriented Si growing on (111) Si substrate.

Carat Weight: This is the unit of weight for diamonds and other precious stones—a Metric Carat=0.200 grams=100 points.

Colorless: This is a property of a diamond with no body color and which is completely transparent. The colorless diamonds are graded as D, E or F. The D and E grades of diamond virtually contain no color. The F grade of diamond contains slight hues of color. Colorless diamonds are extremely rare and expensive.

Near colorless: This is a property of a diamond which contains less amount of color which is barely noticeable to the naked eyes. These types of diamonds are graded as G or H. Diamonds that are graded I or J are also considered near colorless. These diamonds have a slight amount of color which may be evident to the naked eye.

Colored diamonds: These are the diamonds with a detectable hue to them. They contain impurities or structural defects that cause coloration.

The present invention provides a method for producing one or more single crystalline diamonds.

The method involves placing one or more substrates on a substrate holder in a chemical vapor deposition (CVD) vacuum chamber. The growth faces of the one or more substrates have a crystallographic orientation of (100). A mixture of gases is provided adjacent to the one or more substrates in the CVD vacuum chamber. The mixture of gases is exposed to microwave radiation to generate a plasma. Reactive species of nitrogen are introduced in the plasma, such that the concentration of the reactive species of nitrogen is 0.005 ppm to 2 ppm in the mixture of gases. The reactive species of nitrogen are produced in a remote reactive gas generator. The substrates are exposed to the plasma, such that the diamond growth occurs on the growth faces of the one or more substrates at a rate of 10 to 100 microns per hour, to produce the one or more single crystalline diamonds.

FIG. 1 is a flow chart illustrating a method for producing one or more single crystalline diamonds, in accordance with an embodiment of the present invention. At step 102, one or more substrates are placed on a substrate holder in a CVD vacuum chamber. The substrate holder can be made from a suitable material, such as molybdenum and hexagonal boron nitride, which are thermally and chemically stable at high temperatures. However, the invention should not be construed to be limited only to the use of a substrate holder, made of molybdenum and hexagonal boron nitride. Other substrate holders, which are thermally and chemically stable at high temperatures can also be used without deviating from the scope of the invention. In various embodiments of the present invention, the one or more substrates are placed in a MPCVD system. While placing the substrates in the MPCVD system, it is ensured that the growth faces of the one or more substrates are (100) and the other faces, if any, are masked. The substrates are cleaned before placing them in the substrate holder. Cleaning of the substrates is done ultrasonically by using different liquid solvents in an ultrasonic cleaning device. The substrates are first cleaned with sulphuric acid. After this, the substrates are washed with de-mineralized water followed by washing with isopropyl alcohol in the ultrasonic cleaning device.

In an embodiment of the invention, the substrates are diamonds. The present invention is capable of using an HPHT-grown synthetic diamond, a CVD-grown synthetic diamond, and a natural diamond as substrates for growing one or more single crystalline diamonds At step 104, a mixture of gases is provided adjacent to the one or more substrates in the CVD vacuum chamber. The mixture of gases contains a carbon-containing substance and a carrier, which is gaseous under conditions that are present in the CVD vacuum chamber. The carbon-containing substance is a hydrocarbon of up to 5 carbon atoms. In an exemplary embodiment of the invention, the carbon-containing substance is methane, and the carrier is hydrogen. The concentration of methane is 7 percent to 16 percent by the volume of hydrogen. However, the invention should not be construed to be limited to the use of methane as the carbon-containing substance. Other carbon-containing substances such as acetylene, ethylene, and propane, can also be used without deviating from the scope of the invention. Other carriers such as halogens may be used alone or in combination with each other, and hydrogen may also be used without deviating from the scope of the invention. It will be apparent to a person skilled in the art that the carrier serves many purposes such as stabilizing the substrates surfaces, dissolving the carbon in the gas, and generating condensable carbon radicals. In the preferred embodiment of the invention, a flow of hydrogen is maintained in the range of 200 sccm to 1000 sccm, and a flow of methane is maintained at 7% to 16% of hydrogen inside the CVD vacuum chamber. However, the invention should not be construed to be limited to the use of the mixture of gases mentioned above. Other gases, such as argon, oxygen, or gases containing sulfur and phosphorous, can also be used with hydrogen without deviating from the scope of the invention.

At step 106, a plasma is generated from the mixture of gases by exposing the mixture of gases to microwave radiation. However, the invention should not be construed to be limited to the use of microwave radiation for generating the plasma. Other techniques for generating the plasma from the diamond forming gas, such as the application of a direct current or radio frequency radiation or employing a DC plasma jet or arc, can also be availed of, without deviating from the scope of the invention.

At step 108, reactive species of nitrogen are introduced in the plasma. The reactive species of nitrogen, which are free radicals of nitrogen, are produced in a remote reactive gas generator. Reactive gas generators are self contained plasma sources. A weakly ionized plasma, from a variety of input gases, for example, nitrogen, oxygen and argon etc. is generated inside a toroidal flow channel. An integral, high-power RF generator couples electromagnetic energy to electrons in the plasma. This energy is rapidly transferred through collisions to neutral species of the input gases. The resulting gas temperature is estimated to be of the order of 2000° K. At this temperature, thermal dissociation of the input gas yields the reactive neutral species of interest, for example, atomic nitrogen. The power delivered to the plasma is optimized for high dissociation efficiency (typically >95% for nitrogen) over the specified gas flow rates and operating pressure.

In an embodiment of the present invention, the reactive species of nitrogen are free radicals of nitrogen. These free radicals of nitrogen are produced by coupling energy from a microwave power source to a nitrogen-containing gas in a remote reactive gas generator. In an embodiment of the present invention the nitrogen-containing gas is a pure nitrogen gas. Other exemplary nitrogen-containing gases include but are not limited to ammonia and nitrous oxide. The remote reactive gas generator includes waveguides with an applicator at one end. The applicator is a shorted waveguide with a gas flow tube running through it and the nitrogen-containing gas is pumped through the tube. The remote reactive gas generator guides microwave energy through a waveguide to a chamber where the energy is coupled to the nitrogen-containing gas to produce plasma which excites the gas molecules to form the reactive species of nitrogen viz. free radicals of nitrogen. It will be apparent to a person skilled in the art that the remote reactive gas generator is similar to a remote microwave plasma generator. The remote reactive gas generator includes a conventional auto-tuner to generate the conditions suitable for obtaining desired dissociation of nitrogen. The auto-tuner delivers the power to the nitrogen-containing gas such that the plasma is optimized for high dissociation efficiency typically >95% for the generation of reactive species of nitrogen.

In another embodiment of the present invention, the reactive species of nitrogen are atomic nitrogen.

In the preferred embodiment of the invention, the concentration of the reactive species of nitrogen is 0.005 ppm to 2 ppm in the mixture of gases. In another embodiment of the invention, the reactive species of nitrogen are introduced in the plasma, such that the concentration of the reactive species of nitrogen is 0.05 ppm to 1 ppm in the mixture of gases.

At step 110, the one or more substrates are exposed to the plasma containing the reactive species of nitrogen under predefined conditions, such that diamond growth occurs on the growth faces of the one or more substrates at a rate of 10 to 100 microns per hour to produce one or more single crystalline diamonds. It will be apparent to a person skilled in the art that the growth faces (100) of the substrates are exposed to the plasma, and the faces with a crystallographic orientation other than the (100) are masked. In an embodiment of the invention, the substrates are maintained at a temperature ranging from 850° C. to 1250° C. The CVD chamber is maintained at a pressure ranging from 120 Torr to 220 Torr. In various embodiments of the invention, the time period for synthesizing one or more single crystalline diamonds can be varied from 50 hours to 200 hours, depending on the thickness of the diamond growth required on the one or more substrates. In various embodiments of the invention, diamond growth occurs at the rate of 10 to 100 microns per hour. It will be apparent to a person skilled in the art that diamond growth rate depends on the conditions and the mixture of gases used in the CVD chamber.

The one or more single crystalline diamonds thus produced are removed from the MPCVD system. The diamond growth is separated from the one or more substrates through a laser cutting, and then polished. The color of the diamond growth is evaluated after polishing. In accordance with various embodiments of the invention, the one or more single crystalline diamonds produced by the method as described above belong to grade D/E/F (colorless) or G/H/I/J (near colorless). It will be apparent to a person skilled in the art that the one or more single crystalline diamonds produced in accordance with the present invention can be further characterized by means of differential interference-contrast microscopy (DICM), atomic force microscopy (AFM), micro-Raman spectroscopy (laser excitation wavelength of 514.5 nm), and the like.

The following non-limiting examples are provided to illustrate the present invention:

EXAMPLE 1

Producing One or More Single Crystalline Diamonds Belonging to Grade E

Colorless

One or more CVD or HPHT-grown synthetic diamond substrates with an orientation of (100) are cleaned in an ultrasonic cleaning device. The one or more CVD or HPHT-grown synthetic diamond substrates are first washed with sulphuric acid. Thereafter, the substrates are washed with de-mineralized water and then in isopropyl alcohol in the ultrasonic cleaning device. After being cleaned, the one or more CVD or HPHT-grown synthetic diamond substrates are placed in a molybdenum substrate holder in a MPCVD system. While placing the one or more CVD or HPHT-grown synthetic diamond substrates in the MPCVD system, it is ensured that their growth faces are (100) and the other faces, if any, are masked.

A mixture of gases comprising hydrogen and methane is provided adjacent to the one or more CVD or HPHT-grown synthetic diamond substrates. The flow of hydrogen, is maintained at 500 sccm, and the flow of methane is maintained at 43 sccm. A plasma is generated from the mixture of gases by exposing it to microwave radiation.

Reactive species of nitrogen, which are free radicals of nitrogen, are introduced in the plasma, such that the parts per million (ppm) of the reactive species of nitrogen in the mixture of gases is 0.1 ppm. The reactive species of nitrogen are generated in a remote reactive gas generator.

The one or more CVD or HPHT-grown synthetic diamond substrates are maintained at temperature of 950° C. The MPCVD system is maintained at a pressure of 145 Torr. Under these conditions, diamond growth occurs on the one or more CVD or HPHT-grown synthetic diamond substrates. The diamond growth is maintained for 130 hours at an average growth rate of 23 microns per hour, to form one or more single crystalline diamonds having a growth of 3 mm thickness. The one or more single crystalline diamonds thus produced are removed from the MPCVD system and are then polished. The color of the one or more single crystalline diamonds is evaluated after polishing. The one or more single crystalline diamonds belong to grade E (colorless).

In a conventional CVD method, for a growth rate of 23 microns per hour, about 25 ppm to 30 ppm of nitrogen is required to be introduced in the mixture of gases and the one or more single crystalline diamonds that are obtained will be dark brown. Further, if no nitrogen is added, the growth rate will be 5 microns per hour to 6 microns per hour and the time required will be 500 hours to 600 hours to achieve a growth of 3 mm thickness.

EXAMPLE 2

Producing One or More Single Crystalline Diamonds Belonging to Grade G

Near Colorless

One or more CVD or HPHT-grown synthetic diamond substrates with an orientation of (100) are cleaned in an ultrasonic cleaning device. The one or more CVD or HPHT-grown synthetic diamond substrates are first washed with sulphuric acid in the ultrasonic cleaning device. Thereafter, the diamond substrates are washed with de-mineralized water and then in isopropyl alcohol in the ultrasonic cleaning device. After being cleaned, the one or more CVD or HPHT-grown synthetic diamond substrates are placed in a molybdenum substrate holder in the MPCVD system. While placing the one or more CVD or HPHT-grown synthetic diamond substrates in the MPCVD system, it is ensured that their growth faces are (100) and the other faces, if any, are masked.

A mixture of gases comprising hydrogen and methane is provided adjacent to the one or more CVD or HPHT-grown synthetic diamond substrates. The flow of hydrogen is maintained at 500 sccm, and the flow of methane is maintained at 47 sccm. A plasma is generated from the mixture of gases by exposing it to microwave radiation.

Reactive species of nitrogen, which are free radicals of nitrogen, are introduced in the plasma, such that the parts per million (ppm) of the reactive species of nitrogen in the mixture of gases is 0.3 ppm. The reactive species of nitrogen are generated in a remote reactive gas generator.

The one or more CVD or HPHT-grown synthetic diamond substrates are maintained at a temperature of 970° C. The MPCVD system is maintained at a pressure of 155 Torr. Under these conditions, diamond growth occurs on the one or more CVD or HPHT-grown synthetic diamond substrates. Diamond growth is maintained for 70 hours at an average growth rate of 45 microns per hour, to form one or more single crystalline diamonds having a growth of 3.15 mm thickness. The one or more single crystalline diamonds thus produced are removed from the MPCVD system and are then polished. The color of the one or more single crystalline diamonds is evaluated after polishing. The one or more single crystalline diamonds belong to grade G (near colorless).

In a conventional CVD method, for a growth rate of 45 microns per hour, about 100 ppm to 130 ppm of nitrogen is required to be introduced in the mixture of gases and the one or more single crystalline diamonds that are obtained will be dark brown. Further, if no nitrogen is added, the growth rate will be 6 microns per hour to 7 microns per hour and the time required will be 450 hours to 530 hours to achieve a growth of 3.15 mm thickness.

EXAMPLE 3

Producing One or More Single Crystalline Diamonds Belonging to Grade G

Near Colorless

One or more CVD or HPHT-grown synthetic diamond substrates with an orientation of (100) are cleaned in an ultrasonic cleaning device. The one or more CVD or HPHT-grown synthetic diamond substrates are first washed with sulphuric acid in the ultrasonic cleaning device. After this, they are washed with de-mineralized water and then in isopropyl alcohol in the ultrasonic cleaning device. After being cleaned, the one or more CVD or HPHT-grown synthetic diamond substrates are placed in a molybdenum substrate holder in the MPCVD system. While placing the one or more CVD or HPHT-grown synthetic diamond substrates in the MPCVD system, it is ensured that their growth faces are (100) and the other faces, if any, are masked.

A mixture of gases comprising hydrogen and methane is provided adjacent to the one or more CVD or HPHT-grown synthetic diamond substrates. The flow of hydrogen is maintained at 500 sccm, and the flow of methane is maintained at 50 sccm. A plasma is generated from the mixture of gases by exposing it to microwave radiation.

Reactive species of nitrogen, which are free radicals of nitrogen, are introduced in the plasma, such that the parts per million (ppm) of the reactive species of nitrogen in the mixture of gases is 0.8 ppm. The reactive species of nitrogen are generated in a remote reactive gas generator.

The one or more CVD or HPHT-grown synthetic diamond substrates are maintained at a temperature of 1000° C. The MPCVD system is maintained at a pressure of 160 Torr. Under these conditions, diamond growth occurs on the one or more CVD or HPHT-grown synthetic diamond substrates. Diamond growth is maintained for 50 hours at an average growth rate of 75 microns per hour, to form one or more single crystalline diamonds having a growth of 3.75 mm thickness. The one or more single crystalline diamonds thus produced are removed from the MPCVD system and are then polished. The color of the one or more single crystalline diamonds is evaluated after polishing. The one or more single crystalline diamonds belong to grade G (near colorless).

In a conventional CVD method, for a growth rate of 75 microns per hour, more than 150 ppm of nitrogen is required to be introduced in the mixture of gases and the one or more single crystalline diamonds that are obtained are dark brown.

The non-limiting examples described above illustrate that, in the present invention, the addition of reactive species of nitrogen, which are free radicals of nitrogen, in small concentrations in the range of 0.005 ppm to 2 ppm in the plasma is responsible for producing one or more single crystalline diamonds at high growth rates without resulting in browning of the one or more single crystalline diamonds. In a conventional CVD method, addition of nitrogen in large concentrations, such as 10 ppm to 200 ppm, in the mixture of gases is required to obtain the growth rates of 10 microns per hour to 50 microns per hour. Further, the dissociation of nitrogen gas molecules in the plasma to produce reactive species of nitrogen that is required for diamond growth is only 1% to 2%. Therefore, the browning of the one or more single crystalline diamonds takes place as extra nitrogen atoms are incorporated in the one or more single crystalline diamonds. It will be apparent to a person skilled in the art that other operating conditions of an MPCVD system in the conventional CVD method are similar to that present in the CVD vacuum chamber in the present invention.

In accordance with various embodiments of the present invention, the requirement for large concentrations of nitrogen for obtaining high growth rates is significantly reduced. Furthermore, the reactive species of nitrogen produced in a remote reactive gas generator have the dissociation of up to 94%. Therefore, the use of reactive species of nitrogen in the present invention reduces the requirement of nitrogen by two orders of magnitude and results in producing high-quality thick colorless or near colorlessness one or more single crystalline diamonds at high growth rates. There is no browning of the one or more single crystalline diamonds since there are no extra nitrogen atoms that can be incorporated in the diamonds. Furthermore, in accordance with various embodiments of the invention, still higher growth rates (greater than 50 microns per hour) can be obtained without affecting the quality of the diamonds.

In light of the various embodiments described above, the method of the present invention produces one or more single crystalline diamonds for use in jewelry and ornaments as well as in electronics and other scientific applications. Various embodiments of the present invention enable the production of high-quality one or more single crystalline diamonds that are colorless or near colorless. Further, the present invention enables the production of high-quality one or more single crystalline diamonds at very high growth rates using reactive species of nitrogen which are remotely produced in a remote gas generator. Still further, the present invention provides a method for producing one or more single crystalline diamonds which is less time consuming and more economical, by providing reactive species of nitrogen in the plasma. The present invention does not require large concentrations of nitrogen for achieving high growth rates, and at the same time there is no browning of the diamonds. Furthermore, the electronic properties of the one or more single crystalline diamonds are also not affected.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A method for producing one or more single crystalline diamonds, the method comprising the steps of:
   (a) placing one or more substrates on a substrate holder in a chemical vapor deposition (CVD) vacuum chamber, wherein growth faces of the one or more substrates have a crystallographic orientation of (100);
   (b) providing a mixture of gases, including at least one gas having a carbon component, adjacent to the one or more substrates in the CVD vacuum chamber;
   (c) generating plasma from the mixture of gases by exposing the mixture of gases to a microwave radiation;
   (d) introducing free radicals of nitrogen in the plasma, wherein the free radicals of nitrogen are produced in a remote reactive gas generator, wherein concentration of the free radicals of nitrogen is 0.05 ppm to 1 ppm; and
   (e) exposing the one or more substrates to the plasma under conditions wherein diamond growth occurs on the growth faces of the one or more substrates to produce the one or more single crystalline diamonds.

2. The method of claim 1, wherein the one or more substrates are diamonds.

3. The method of claim 1, wherein the one or more substrates are selected from the group consisting of a natural diamond, a HPHT grown synthetic diamond and a CVD grown synthetic diamond.

4. The method of claim 1, wherein the one or more substrates are cleaned before the one or more substrates are placed on the substrate holder in the CVD vacuum chamber.

5. The method of claim 1, wherein the mixture of gases comprises hydrogen and methane.

6. The method of claim 5, wherein the mixture of gases further comprises oxygen.

7. The method of claim 1, wherein the one or more substrates are maintained at a temperature ranging from 850° degree C. to 1250° degree C. in the CVD vacuum chamber.

8. The method of claim 1, wherein the CVD vacuum chamber is maintained at a pressure ranging from 120 to 220 Torr.

9. The method of claim 1, wherein the diamond growth occurs inside the CVD vacuum chamber for 50 to 200 hours.

10. The method of claim 1, wherein the diamond growth occurs at a rate of 10 to 100 microns per hour.

11. The method of claim 1, wherein the step of providing the mixture of gases adjacent to the one or more substrates in the CVD vacuum chamber further comprises maintaining a flow of hydrogen at 500 sccm.

12. The method of claim 1, wherein the step of providing the mixture of gases adjacent to the one or more substrates in the CVD vacuum chamber further comprises maintaining a flow of methane at 35 sccm to 80 sccm.

13. The method of claim 1, wherein the one or more single crystalline diamonds are colorless.

14. The method of claim 1, wherein the one or more single crystalline diamonds are near colorless.

15. A method for producing one or more single crystalline diamonds, the method comprising the steps of:
   (a) placing one or more substrates on a substrate holder in a chemical vapor deposition (CVD) vacuum chamber, wherein growth faces of the one or more substrates have a crystallographic orientation of (100);
   (b) providing a mixture of gases, including at least one gas having a carbon component, adjacent to the one or more substrates in the CVD vacuum chamber;
   (c) generating plasma from the mixture of gases by exposing the mixture of gases to a microwave radiation;
   (d) introducing free radicals of nitrogen in the plasma, wherein the free radicals of nitrogen are produced in a remote reactive gas generator, wherein concentration of the free radicals of nitrogen is 0.005 ppm to 2 ppm; and
   (e) exposing the one or more substrates to the plasma under conditions wherein diamond growth occurs on the growth faces of the one or more substrates to produce the one or more single crystalline diamonds.

16. The method of claim 15, wherein the one or more substrates are diamonds.

17. The method of claim 15, wherein the one or more substrates are selected from the group consisting of a natural diamond, a HPHT grown synthetic diamond and a CVD grown synthetic diamond.

18. The method of claim 15, wherein the one or more substrates are cleaned before the one or more substrates are placed on the substrate holder in the CVD vacuum chamber.

19. The method of claim 15, wherein the mixture of gases comprises hydrogen and methane.

20. The method of claim 19, wherein the mixture of gases further comprises oxygen.

21. The method of claim 15, wherein the one or more substrates are maintained at a temperature ranging from 850° degree C. to 1250° degree C. in the CVD vacuum chamber.

22. The method of claim 15, wherein the CVD vacuum chamber is maintained at a pressure ranging from 120 to 220 Torr.

23. The method of claim 15, wherein the diamond growth occurs inside the CVD vacuum chamber for 50 to 200 hours.

24. The method of claim 15, wherein the diamond growth occurs at a rate of 10 to 100 microns per hour.

25. The method of claim 15, wherein the step of providing the mixture of gases adjacent to the one or more substrates in the CVD vacuum chamber further comprises maintaining a flow of hydrogen at 500 sccm.

26. The method of claim 15, wherein the step of providing the mixture of gases adjacent to the one or more substrates in the CVD vacuum chamber further comprises maintaining a flow of methane at 35 sccm to 80 sccm.

27. The method of claim 15, wherein the one or more single crystalline diamonds are colorless.

28. The method of claim 15, wherein the one or more single crystalline diamonds are near colorless.

\* \* \* \* \*